(12) United States Patent
Mills et al.

(10) Patent No.: US 7,916,470 B2
(45) Date of Patent: Mar. 29, 2011

(54) DOCKING PLENUM FOR A RACK

(75) Inventors: R. Steven Mills, Cedar Park, TX (US); Ty R. Schmitt, Round Rock, TX (US)

(73) Assignee: Dell Products L.P., Round Rock, TX (US)

( * ) Notice: Subject to any disclaimer, the term of this patent is extended or adjusted under 35 U.S.C. 154(b) by 34 days.

(21) Appl. No.: 12/101,521

(22) Filed: Apr. 11, 2008

(65) Prior Publication Data

US 2009/0257188 A1      Oct. 15, 2009

(51) Int. Cl.
   *G06F 1/20*      (2006.01)
   *H05K 7/20*      (2006.01)
(52) U.S. Cl. ........... 361/679.49; 361/679.5; 361/690; 361/692; 361/716; 312/236; 454/184
(58) Field of Classification Search .......... 361/679.46, 361/679.48–679.51, 690, 694–695, 716, 361/692; 312/223.2, 236; 454/184
See application file for complete search history.

(56) References Cited

U.S. PATENT DOCUMENTS

| | | | | |
|---|---|---|---|---|
| 3,058,320 | A * | 10/1962 | Foster et al. | 62/382 |
| 3,282,382 | A * | 11/1966 | Thompson | 186/54 |
| 3,836,220 | A * | 9/1974 | Ishammar | 312/236 |
| 4,087,142 | A * | 5/1978 | Aumack | 312/236 |
| 4,203,486 | A * | 5/1980 | Rubbright et al. | 165/48.1 |
| 4,421,300 | A * | 12/1983 | Lundman | 254/88 |
| 4,683,424 | A * | 7/1987 | Cutright et al. | 324/537 |
| 5,443,312 | A * | 8/1995 | Schluter | 312/334.27 |
| 5,664,930 | A * | 9/1997 | Ellis | 414/401 |
| 6,496,366 | B1 * | 12/2002 | Coglitore et al. | 361/679.46 |
| 6,684,657 | B1 * | 2/2004 | Dougherty | 62/237 |
| 6,741,467 | B2 * | 5/2004 | Coglitore et al. | 361/679.4 |
| 6,822,859 | B2 * | 11/2004 | Coglitore et al. | 361/679.49 |
| 6,850,408 | B1 * | 2/2005 | Coglitore et al. | 361/679.4 |
| 7,145,772 | B2 * | 12/2006 | Fink | 361/695 |
| 7,286,345 | B2 * | 10/2007 | Casebolt | 361/679.48 |
| 7,372,695 | B2 * | 5/2008 | Coglitore et al. | 361/679.48 |
| 7,407,238 | B2 * | 8/2008 | Fitzgerald | 312/311 |

(Continued)

FOREIGN PATENT DOCUMENTS

JP      11189100 A  *  7/1999

(Continued)

*Primary Examiner* — Robert J Hoffberg
(74) *Attorney, Agent, or Firm* — Baker Botts L.L.P.

(57) ABSTRACT

A docking plenum for a rack is disclosed. The docking plenum includes a pair of sides that are coupled to first and second panels at the top of the docking plenum. The panels at the top of the docking plenum are separated from one another by an aperture. The docking plenum includes a front opening and a rear opening between the two sides. Each of the front opening and the rear opening are sized to receive a rack. The placement of a first rack in the front opening and a second rack in the rear opening creates a heated air cavity that is formed by the racks, the floor of the docking plenum, and the panels at the top of the docking plenum. When the racks are placed in the opening, and when one or more fans in the computer systems are activated, the fans draw air from outside the plenum across the interior of the computer systems. Heated air exits the computer systems and enters the heated air cavity. The heated air exits the heated air cavity through the aperture in the top of the docking plenum. Each rack may include wheels.

9 Claims, 2 Drawing Sheets

U.S. PATENT DOCUMENTS

| | | | |
|---|---|---|---|
| 7,469,849 B1 * | 12/2008 | Lo | 241/100 |
| 7,477,514 B2 * | 1/2009 | Campbell et al. | 361/699 |
| 7,499,273 B2 * | 3/2009 | Casebolt | 361/679.48 |
| 7,508,663 B2 * | 3/2009 | Coglitore | 361/695 |
| 7,525,797 B2 * | 4/2009 | Coglitore et al. | 361/724 |
| 7,660,121 B2 * | 2/2010 | Campbell et al. | 361/698 |
| 7,688,578 B2 * | 3/2010 | Mann et al. | 361/679.46 |
| 2005/0280986 A1 * | 12/2005 | Coglitore et al. | 361/687 |
| 2006/0260338 A1 * | 11/2006 | VanGilder et al. | 62/259.2 |

FOREIGN PATENT DOCUMENTS

JP 2008103391 A * 5/2008

* cited by examiner

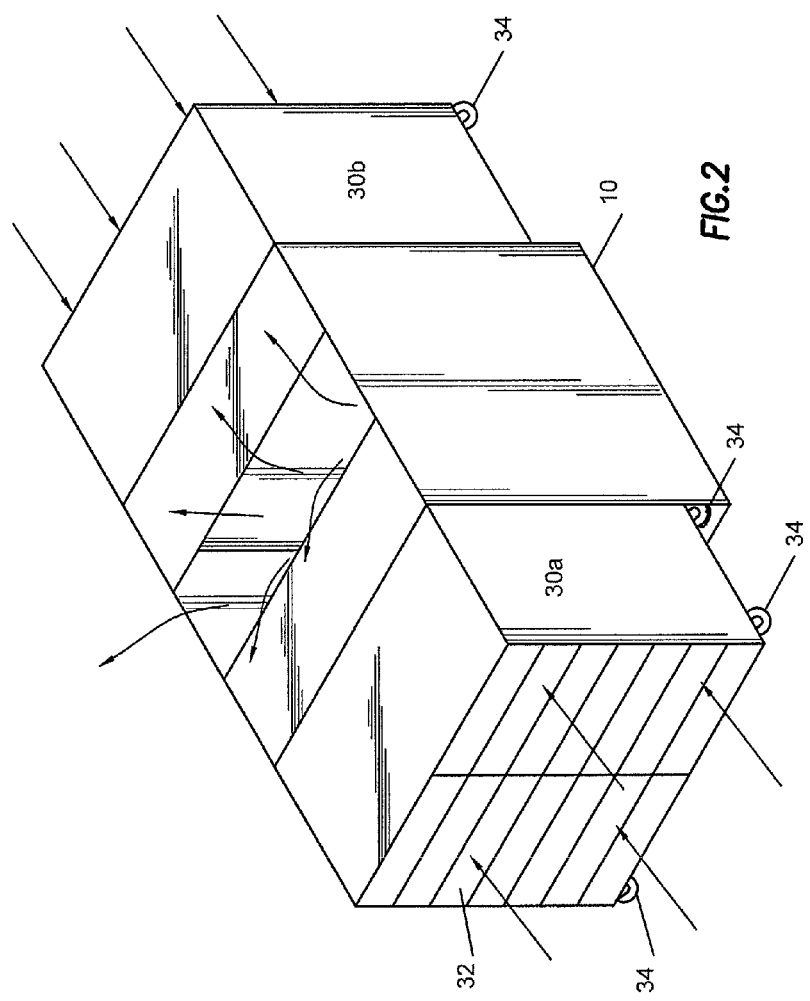

DOCKING PLENUM FOR A RACK

TECHNICAL FIELD

The present disclosure relates generally to computer systems and information handling systems, and, more particularly, to a docking plenum for a rack.

BACKGROUND

As the value and use of information continues to increase, individuals and businesses seek additional ways to process and store information. One option available to these users is an information handling system. An information handling system generally processes, compiles, stores, and/or communicates information or data for business, personal, or other purposes thereby allowing users to take advantage of the value of the information. Because technology and information handling needs and requirements vary between different users or applications, information handling systems may vary with respect to the type of information handled; the methods for handling the information; the methods for processing, storing or communicating the information; the amount of information processed, stored, or communicated; and the speed and efficiency with which the information is processed, stored, or communicated. The variations in information handling systems allow for information handling systems to be general or configured for a specific user or specific use such as financial transaction processing, airline reservations, enterprise data storage, or global communications. In addition, information handling systems may include or comprise a variety of hardware and software components that may be configured to process, store, and communicate information and may include one or more computer systems, data storage systems, and networking systems.

An information handling system, such as a server system, may be placed within a rack. A rack may house multiple server systems, and multiple racks are typically placed in a room that is known as a data center or server room. A typical server room will include rows of racks. One difficulty of data centers is the heat generated by the multiple server computers in the data center. Excessive heat leads to high cooling costs for a data center and can result in the degradation in the performance of the computer systems of the rack or data center. In some cases, racks are placed in a back-to-back configuration in which cool air enters the front of each rack and heated air is exhausted out of the back of each rack. This configuration creates a cool aisle in the front of each rack and a hot aisle between the racks. One difficulty that accompanies the creation of a cool aisle is the evacuation of the heat from the cool aisle and outside the data room.

SUMMARY

In accordance with the present disclosure, a docking plenum for a rack is disclosed. The docking plenum includes a pair of sides that are coupled to first and second panels at the top of the docking plenum. The panels at the top of the docking plenum are separated from one another by an aperture. The docking plenum includes a front opening and a rear opening between the two sides. Each of the front opening and the rear opening are sized to receive a rack. Each of the racks may include computer systems, and each computer system may include a fan. The placement of a first rack in the front opening and a second rack in the rear opening creates a heated air cavity that is formed by the racks, the floor of the docking plenum, and the panels at the top of the docking plenum.

When the racks are placed in the opening, and when one or more fans in the computer systems are activated, the fans draw air from outside the plenum across the interior of the computer systems. Heated air exits the computer systems and enters the heated air cavity. The heated air exits the heated air cavity through the aperture in the top of the docking plenum. Each rack may include wheels. The racks may be coupled to the docking plenum by placing the wheels of the rack in engagement divots formed on the floor of the docking plenum.

The devices described herein are technically advantageous because the structure provides both a docking location for a rack that holds the rack in a stationary location and that provides a plenum for directing air through and away from a hot aisle formed between adjacent racks. Other technical advantages will be apparent to those of ordinary skill in the art in view of the following specification, claims, and drawings.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein:

FIG. 2 is a pictorial view of a racks placed in the opening of the docking plenum of FIG. 1.

DETAILED DESCRIPTION

Figure 1:
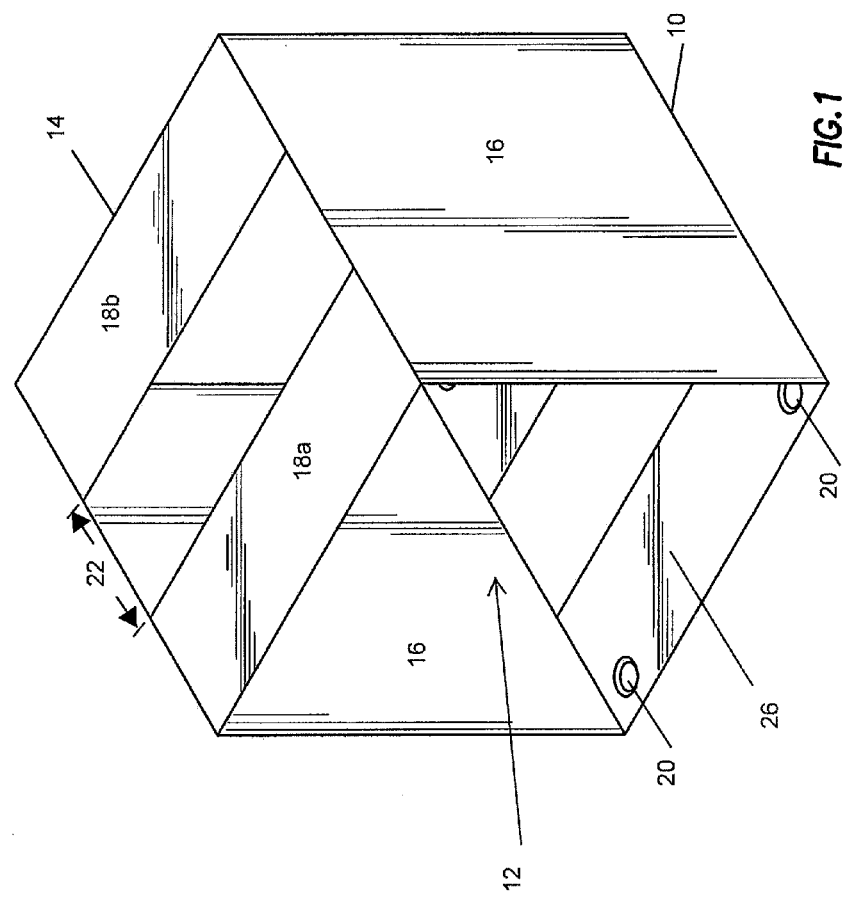
FIG. 1 is a pictorial view of a docking plenum.

For purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, an information handling system may be a personal computer, a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communication with external devices as well as various input and output (I/O) devices, such as a keyboard, a mouse, and a video display. The information handling system may also include one or more buses operable to transmit communications between the various hardware components.

An information handling system may be housed within a rack. Two or more racks may be placed in a back-to-back configuration in a physical enclosure known as a docking plenum. An example of a docking plenum 10 is shown in FIG. 1. Docking plenum 10 includes a front opening 12 and a rear opening 14. Between front opening 12 and rear opening 14 are two sides 16, which are shown in FIG. 1 as being solid. In the example of FIG. 1, sides 16 are opaque; sides 16 could also be transparent. The top of docking plenum 10 includes a front panel 18a and a back panel 18b. Front panel 18a and back panel 18b are solid and separated from one another by a top aperture 22. In the example of FIG. 1, the length of top aperture 22 is the same as the length of front face 12. The size of top aperture may be smaller than that shown in FIG. 1.

In FIG. 2, first and second racks 30a and 30b are placed within docking plenum 10. Rack 30a is placed in the front opening of docking plenum 10, and rack 30b is placed within the rear opening of docking plenum 10. Each of racks 30a and 30b house a number of computing systems, which are each indicated generally at 32. In the configuration of FIG. 2, the space within the docking plenum between the racks 30a and 30b forms a hot aisle between the two racks.

In operation, cooled or unheated air enters the computer systems of each of the racks in the direction of the arrows in FIG. 2. The air that enters each of the racks is cooled or unheated air from the cool aisle that is in the front of each of the racks. Cooled or unheated air may be drawn into the computer systems in the direction of the arrows by fans in the interior of the computer systems. Once the air enters the computer systems, the air blows across the components in the interior of the computer system. The air passing over the heated components results in a heat exchange in which the cooled or unheated air becomes heated. The air passing over the components in the interior of the computer system next exits the racks into a central heated air cavity formed by the racks and the docking plenum. The only exit for the heated air from this heated air cavity is the top aperture 22, as indicated by the arrows in FIG. 2.

Any suitable engagement mechanism can be used for locking a rack in the disclosed docking plenum. As shown in FIG. 1, docking plenum 10 includes a pair of engagement divots 20 that are formed in the floor 26 of docking plenum 10. Engagement divots 20 are sized and spaced apart to receive the wheels 34 of racks 30a and 30b. When the wheels of racks 30a and 30b are placed in the engagement divots 20, racks 30a and 30b are locked into place and cannot roll across the floor of the rack room.

In the example of FIGS. 1 and 2, only two racks are shown, one in the front of the docking plenum and the other in the back of the docking plenum. It should be appreciated that the docking plenum could be sized to receive multiple racks aligned in a row across the front and rear sides of the docking plenum. The docking plenum disclosed herein is advantageous because the structure provides both a docking location for a rack that holds the rack in a stationary location and that provides a plenum for directing air through and away from a hot aisle formed between adjacent racks. Although the present disclosure has been described in detail, it should be understood that various changes, substitutions, and alterations can be made hereto without departing from the spirit and the scope of the invention as defined by the appended claims.

What is claimed is:

1. A docking plenum, comprising:
a pair of sides;
a front panel between the pair of sides;
a rear panel between the pair of sides, wherein the front panel and the rear panel are separated from one another by an aperture;
a floor between the pair of sides; and
engagement divots formed in the floor;
wherein the pair of sides, the floor, and the front panel define a front opening that is sized to receive a first rack on a first set of wheels, wherein the first set of wheels comprises at least one first-set wheel;
wherein the pair of sides, the floor, and the rear panel define a rear opening that is sized to receive a second rack on a second set of wheels, wherein the second set of wheels comprises at least one second-set wheel;
wherein the docking plenum is sized to at most partially contain the first rack and the second rack; and
wherein the engagement divots are spaced apart from one another so as to align with the first set of wheels and the second set of wheels when the first rack and the second rack are partially contained within the docking plenum.

2. The docking plenum of claim 1, wherein each of the engagement divots is sized to accommodate one of the at least one first-set wheel or one of the at least one second-set wheel.

3. The docking plenum of claim 1,
wherein the aperture has a first length;
wherein the front opening has a second length; and
wherein the first length is the same as the second length.

4. A set of racks and a docking plenum, comprising:
the docking plenum, comprising:
a pair of sides;
a floor between the pair of sides, wherein the floor includes a first pair of engagement divots and a second pair of engagement divots;
a front panel between the pair of sides; and
a rear panel between the pair of sides, wherein the front panel and the rear panel are separated from one another by an aperture;
wherein the pair of sides, the floor, and the front panel defines a front opening that is sized to receive a first rack mounted on a first set of wheels, wherein the first set of wheels comprises at least one first-set wheel;
wherein the pair of sides, the floor, and the rear panel defines a rear opening that is sized to receive a second rack mounted on a second set of wheels, wherein the second set of wheels comprises at least one second-set wheel;
wherein the docking plenum is sized to at most partially contain the first rack and the second rack; and
wherein the first pair of engagement divots and the second pair of engagement divots are spaced apart from one another so as to align with the first set of wheels and the second set of wheels, respectively, when the first rack and the second rack are partially contained within the docking plenum: the first rack placed in the front opening; and the second rack placed in the rear opening.

5. The set of racks and a docking plenum of claim 4, wherein each of the at least one first-set wheel is placed in one of the first pair of engagement divots and each of the at least one second-set wheel is placed in one of the second pair of engagement divots.

6. The set of racks and a docking plenum of claim 4, wherein a cavity is formed on three sides by the floor, the first rack, and the second rack.

7. The set of racks and docking plenum of claim 4, wherein each of the engagement divots of the first pair of engagement divots is sized to receive the at least one first-set wheel and each of the engagement divots of the second pair of engagement divots is sized to receive the at least one second-set wheel.

8. The set of racks and docking plenum of claim 4,
wherein the aperture has a first length;
wherein the front opening has a second length; and
wherein the first length is the same as the second length.

9. A method for directing air through a rack system and docking plenum, comprising:
providing a docking plenum, wherein the docking plenum comprises:
a pair of sides;
a floor between the pair of sides, wherein the floor includes engagement divots;
a front panel between the pair of sides; and
a rear panel between the pair of sides, wherein the front panel and the rear panel are separated from one another by an aperture;

wherein the pair of sides, the floor, and the front panel defines a front opening that is sized to receive a first rack mounted on a first set of wheels;

wherein the pair of sides, the floor, and the rear panel defines a rear opening that is sized to receive a second rack mounted on a second set of wheels;

wherein the docking plenum is sized to at most partially contain the first rack and the second rack; and wherein the engagement divots are spaced apart from one another so as to align with the first set of wheels and the second set of wheels when the first rack and the second rack are partially contained within the docking plenum:

providing the first rack mounted on the first set of wheels that is coupled to the docking plenum at the first opening, wherein the first rack includes a first computer system;

providing the second rack mounted on the second set of wheels that is coupled to the docking plenum at the second opening, wherein the second rack includes a second computer system; and directing exiting the first rack and the second rack to exit the docking plenum through the aperture.

\* \* \* \* \*